United States Patent
Tu et al.

(10) Patent No.: US 9,502,453 B2
(45) Date of Patent: Nov. 22, 2016

(54) SOLID-STATE IMAGING DEVICES

(71) Applicant: VisEra Technologies Company Limited, Hsin-Chu (TW)

(72) Inventors: Zong-Ru Tu, Keelung (TW); Chung-Hao Lin, Keelung (TW); Yu-Kun Hsiao, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 13/829,126

(22) Filed: Mar. 14, 2013

(65) Prior Publication Data

US 2014/0264686 A1    Sep. 18, 2014

(51) Int. Cl.
*H01L 27/146* (2006.01)

(52) U.S. Cl.
CPC ... *H01L 27/14627* (2013.01); *H01L 27/14621* (2013.01); *H01L 27/14623* (2013.01)

(58) Field of Classification Search
None
See application file for complete search history.

(56) References Cited

U.S. PATENT DOCUMENTS

| | | | |
|---|---|---|---|
| 4,565,756 A * | 1/1986 | Needs et al. | 430/7 |
| 7,659,929 B2 | 2/2010 | Sakoh | |
| 8,049,805 B2 | 11/2011 | Fukuyoshi et al. | |
| 8,139,131 B2 | 3/2012 | Komatsu et al. | |
| 8,530,266 B1 * | 9/2013 | Chen et al. | 438/73 |
| 2006/0205107 A1 * | 9/2006 | Inaba et al. | 438/57 |
| 2008/0291374 A1 * | 11/2008 | Wang et al. | 349/106 |
| 2010/0051790 A1 * | 3/2010 | Park | 250/227.2 |
| 2010/0060769 A1 * | 3/2010 | Inuiya | 348/311 |
| 2010/0245638 A1 * | 9/2010 | Ota | 348/280 |
| 2010/0291296 A1 * | 11/2010 | Chae et al. | 427/162 |
| 2011/0298074 A1 * | 12/2011 | Funao | H01L 27/14629 257/432 |
| 2012/0235266 A1 | 9/2012 | Ootsuka | |
| 2012/0267745 A1 * | 10/2012 | Tsuji | 257/432 |
| 2013/0134536 A1 * | 5/2013 | Mori et al. | 257/432 |

(Continued)

FOREIGN PATENT DOCUMENTS

| | | |
|---|---|---|
| CN | 101848345 A | 9/2010 |
| CN | 102280460 A | 12/2011 |

(Continued)

OTHER PUBLICATIONS

Japanese Office Action for Japanese Application No. 2013-142551 dated May 7, 2014 with English translation.

(Continued)

*Primary Examiner* — Peniel M Gumedzoe
*Assistant Examiner* — Christopher Johnson
(74) *Attorney, Agent, or Firm* — Muncy, Geissler, Olds & Lowe, P.C.

(57) ABSTRACT

A solid-state imaging device is provided. The solid-state imaging device includes a semiconductor substrate containing a plurality of image sensors. A color filter including a plurality of color filter segments is disposed above the semiconductor substrate. Each of the color filter segments corresponds to one of the image sensors. Further, a plurality of partitions is disposed between the color filter segments. Each of the partitions is disposed between any two adjacent color filter segments. The partition has a height smaller than the height of the color filter segment, wherein the height of the partition is based on the bottom of the color filter segment to the top of the partition, and the height of the color filter segment is based on the bottom of the color filter segment to the top of the color filter segment.

13 Claims, 7 Drawing Sheets

(56) References Cited

U.S. PATENT DOCUMENTS

2013/0134537 A1* 5/2013 Nakajiki et al. .............. 257/432
2013/0248868 A1* 9/2013 Jung et al. ...................... 257/59
2013/0307104 A1* 11/2013 Tsai et al. ..................... 257/432

FOREIGN PATENT DOCUMENTS

| CN | 102683365 A | 9/2012 |
|---|---|---|
| CN | 102893400 A | 1/2013 |
| JP | H 07-43517 A | 2/1995 |
| JP | 2006-066430 A | 3/2006 |
| JP | 2006-196553 A | 7/2006 |
| JP | 2006-351801 A | 12/2006 |
| JP | 2011-40454 A | 2/2011 |
| JP | 2011-123111 A | 6/2011 |
| JP | 2011-249677 A | 12/2011 |
| JP | 2011-258728 A | 12/2011 |
| JP | 2012-191136 A | 10/2012 |
| JP | 2012-238774 A | 12/2012 |
| WO | WO 2011/142065 A1 | 11/2011 |

OTHER PUBLICATIONS

Office Action issued by the Twainese Patent Office in corresponding TW Patent Application No. 102119882 on Mar. 26, 2015.
Office Action of corresponding JP patent applciation No. 2013-142551 issued on Feb. 16, 2015 with English translation thereof.
Office Action dated Apr. 27, 2016 issued in corresponding CN Patent Application No. 201310244660.X (7 pages).

* cited by examiner

SOLID-STATE IMAGING DEVICES

BACKGROUND OF THE INVENTION

Field of the Invention

The invention relates to a solid-state imaging device, and more particularly to a solid-state imaging device having partitions disposed in a color filter, and a method of forming the solid-state imaging device.

Description of the Related Art

Generally, solid-state imaging devices have a photoelectric transducer for converting light into electric charges, such as a charge coupled device (CCD), a metal oxide semiconductor (MOS) device, etc. Solid-state imaging devices have been used in various image-capturing apparatuses, for example video cameras, digital cameras, etc.

The solid-state imaging device may be a color solid-state imaging device, which has a color filter. In a conventional color solid-state imaging device, a primary-color filter consisting of a plurality of red (R), blue (B), and green (G) color filter portions is disposed over the light-receiving surface of two-dimensionally arranged photoelectric transducers provided on a semiconductor substrate. Each color filter portion of the primary-color filter corresponds to one photoelectric transducer.

In a conventional color filter, the red (R), blue (B), and green (G) color filter portions are adjacent together without gaps therebetween. However, light entering the color solid-state imaging device may be not perpendicular to the light-receiving surface of the two-dimensionally arranged photoelectric transducers. If light obliquely enters the light-receiving surface and passes through one color filter portion, the light will obliquely reach a photoelectric transducer corresponding to a color filter portion adjacent to the color filter portion which has the light passing through. As a result, color mixing occurs in solid-state imaging devices with a conventional color filter.

In order to avoid color mixing, a solid-state imaging device disclosed in U.S. Pat. No. 8,139,131 B2 provides a plurality of color filter segments mutually separated by interstices. The interstices contain a gas.

In order to avoid color mixing, a color-imaging device disclosed in U.S. Pat. No. 8,049,805 B2 provides a color filter including a plurality of coloring layers. Each of the coloring layers of the color filter include a side surface that is erected with respect to the surface of a semiconductor substrate, and an inclined surface that is continuous from the end of the side surface located on the opposite side of the semiconductor substrate toward the end portion of the coloring layer located on the opposite side of the semiconductor substrate. The coloring layers are arranged with their side surfaces being in contact with each other without a gap therebetween, and the end portion of the coloring layer has a curved surface.

Recently, the number of pixels of imaging devices has reached into the millions. The percentage of the area occupied by various wiring lines and electronic circuits required to operate each pixel is increased in each pixel with such advancements in high pixilation. As a result, the percentage of the area that can actually be utilized for the photoelectric transducers to receive light is decreased in each pixel. This means that the luminous sensitivity of the imaging device is reduced.

The above mentioned imaging devices provide a color filter to avoid color mixing, but the imaging devices do not provide a means to enhance the luminous sensitivity thereof, especially for a color filter containing white (W) color segments.

BRIEF SUMMARY OF THE INVENTION

In an exemplary embodiment, a solid-state imaging device is provided. The solid-state imaging device comprises a first color filter segments having a first height measured from a bottom surface of the first color filter segment to a top surface of the first color filter segment and a second color filter segment having a second height measured from a bottom surface of the second color filter segment to a top surface of the second color filter segment. A partition is disposed between the first and second color filter segments and has a third height measured from a bottom surface of the partition to a top surface of the partition. The partition has a refractive index lower than those of the first and second color filter segments. The third height is smaller than the first and second heights.

In an exemplary embodiment, a solid-state imaging device is provided. The solid-state imaging device comprises a semiconductor substrate including a plurality of image sensors formed thereon. A color filter including a plurality of color filter segments is disposed above the semiconductor substrate. Each of the color filter segments includes a side surface and an upper portion disposed above the side surface. Further, a plurality of partitions is disposed between the color filter segments, wherein each of the partitions is disposed between any two adjacent color filter segments. The partition has a refractive index lower than that of the color filter segment. In addition, the upper portion of the color filter segment includes an inclined surface from the top of the partition toward the top of the color filter segment.

According to the embodiments, the sensitivity of the solid-state imaging device for luminance is enhanced. Moreover, the sensitivity of white (W) pixels of the solid-state imaging device for luminance is further enhanced. The white (W) pixels of the solid-state imaging device correspond to white (W) color segments of a color filter. In addition, the sensitivity of the solid-state imaging device operated in a low-luminance environment is also improved.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
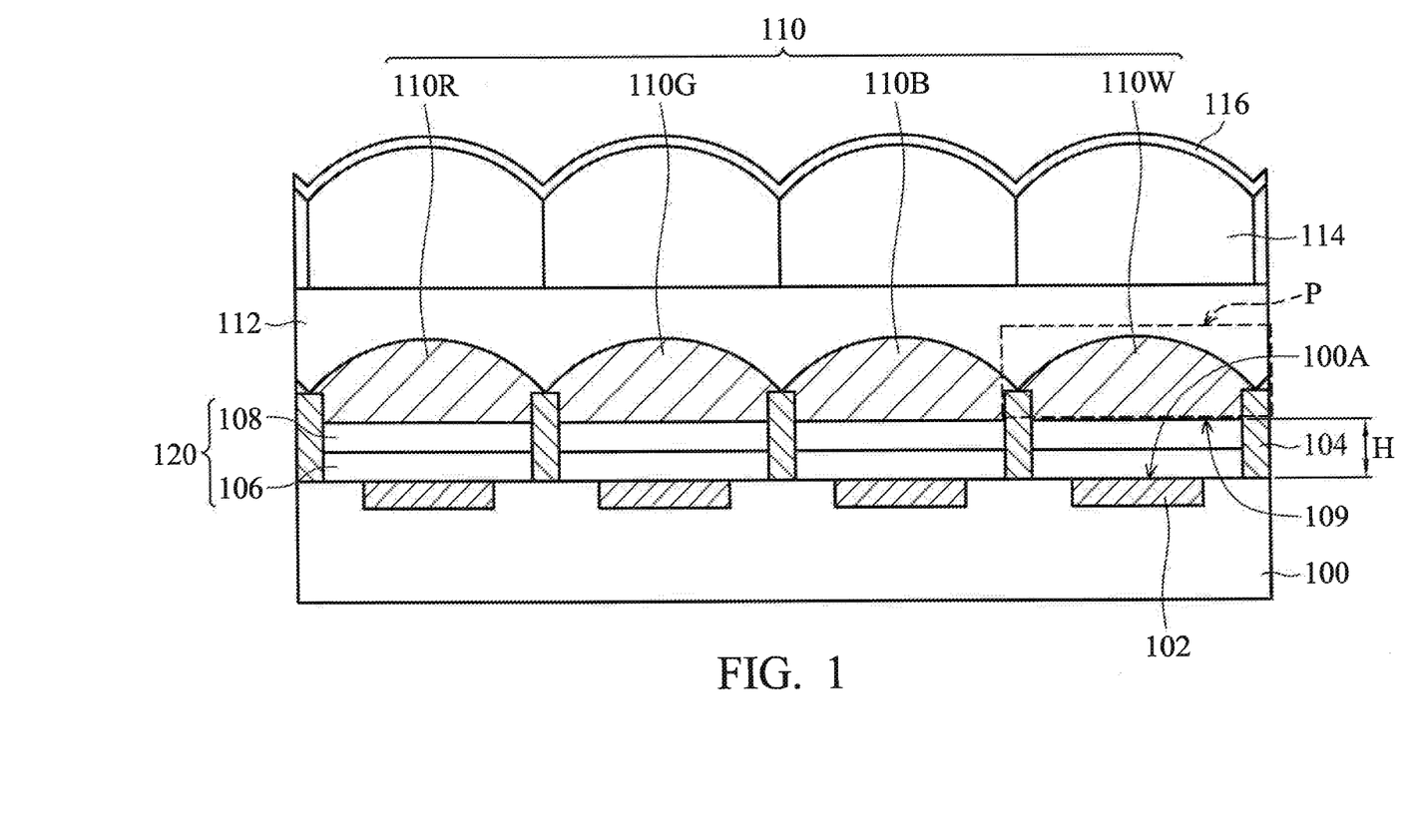
FIG. 1 shows a schematic partial cross-section of a solid-state imaging device according to an embodiment of the invention.

Referring to FIG. 1, a partial cross-section of a solid-state imaging device according to an embodiment of the invention is shown. The solid-state imaging device includes a semiconductor substrate 100 containing a plurality of image sensors 102 formed thereon. The image sensor 102 may be a complementary metal oxide semiconductor (CMOS) device or a charge coupled device (CCD). Moreover, various wiring lines and electronic circuits required to operate each image sensor 102 are also formed on the semiconductor substrate 100. The semiconductor substrate 100 may be a wafer or a chip.

A plurality of partitions 104 is disposed on the semiconductor substrate 100 to define each pixel corresponding to each of the image sensors 102. In an embodiment, the bottoms of the partitions 104 are formed on the top surface 100A of the semiconductor substrate 100. A color filter 110 including a plurality of color filter segments is disposed above the semiconductor substrate 100. Each of the color filter segments has one color, for example red, green, blue, or white. The color filter 100 may consist of red (R) color segments 110R, green (G) color segments 110G, blue (B) color segments 110B, and white (W) color segments 110W. Each of the partitions 104 is disposed between any two adjacent color filter segments. For example, a partition 104 is disposed between a blue (B) color segment 110B and a white (W) color segment 110W, etc. Furthermore, each of the color filter segments 110R, 110G, 110B and 110W corresponds to each of the image sensors 102.

The partitions 104 are made of a low refractive index (n) material. The refractive index of the partitions 104 is lower than the refractive index of the color filter segments 110R, 110G, 110B, and 110W of the color filter 110. The partitions 104 can be made of $SiO_2$, SiN, SiON or another suitable material having a low refractive index.

A color filter underlying layer 120, such as an anti-current leakage layer 106 and an anti-reflection layer 108, can be disposed between the semiconductor substrate 100 and the color filter 110. The anti-current leakage layer 106 is formed on the semiconductor substrate 100 and the anti-reflection layer 108 is formed on the anti-current leakage layer 106. Furthermore, the anti-current leakage layer 106 and the anti-reflection layer 108 are surrounded by the partitions 104. The anti-curent leakage layer 106 and the anti-reflection layer 108 can be made of a metallic material. Other layers with suitable functions also can be disposed between the semiconductor substrate 100 and the color filter 110, not limited to the anti-current leakage layer 106 and the anti-reflection layer 108. The bottom of the partition 104 is formed on the top surface 100A of the semiconductor substrate 100. Therefore, the height H of the partition 104, based on the top surface 100A of the semiconductor substrate 100 to the bottom 109 of the color filter 110, is determined by the sum of thicknesses of the layers disposed between the semiconductor substrate 100 and the color filter 110.

Figure 2A:
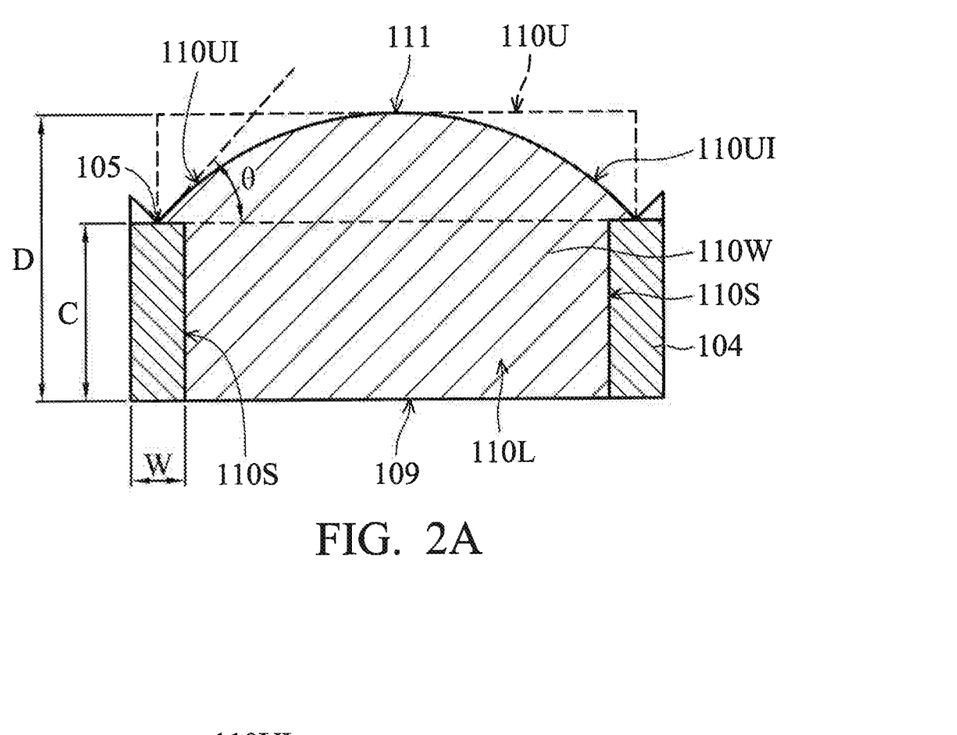
FIGS. 2A-2D show several enlarged schematic cross-sections of a portion P of the solid-state imaging device of FIG. 1 according to various embodiments of the invention.

Referring to FIG. 2A, an enlarged cross-section of a portion P of the solid-state imaging device of FIG. 1 according to an embodiment is shown. As shown in FIG. 2A, the partition 104 has a height C based on the bottom 109 of the color filter segment 110W to the top 105 of the partition 104. The color filter segment 110W has a height D based on the bottom 109 of the color filter segment 110W to the top 111 of the color filter segment 110W, i.e. the height D is the maximum thickness of the color filter segment 110W. According to embodiments of the invention, the height C of the partition 104 is smaller than the height D of the color filter segment 110W. Preferably, the height C of the partition 104 is about 40-80% of the height D of the color filter segment 110W. According to embodiments of the invention, the partition 104 has a width W of about 0.08-0.20 µm. FIG. 2A only shows one color filter segment 110W as a representative of the color filter segments of the color filter 110. However, the other color filter segments 110R, 110G and 110B of the color filter 110 have structural characteristics the same as that of the color filter segment 110W.

As shown in FIG. 2A, the color filter segment 110W includes a lower portion 110L having a side surface 110S in contact with the partitions 104. Further, the color filter segment 110W includes an upper portion 110U above the side surface 110S of the lower portion 110L. The upper portion 110U includes an inclined surface 110UI from the top surface 105 of the partition 104 toward the top surface 111 of the color filter segment 110W. There is an angle θ between the inclined surface 110UI of the color filter segment 110W and the top surface 105 of the partition 104. According to embodiments of the invention, the angle θ is about 12-50 degrees.

In an embodiment, as shown in FIG. 2A, the inclined surface 110UI of the color filter segment 110W covers at least a part of the top surface 105 of the partition 104. For example, the inclined surface 110UI of the color filter segment 110W may cover a half of the top surface 105 of the partition 104. Another half of the top surface 105 of the partition 104 is covered by an inclined surface of another color filter segment adjacent to the color filter segment 110W, such as a color filter segment 110B or 110R.

Figure 2B:
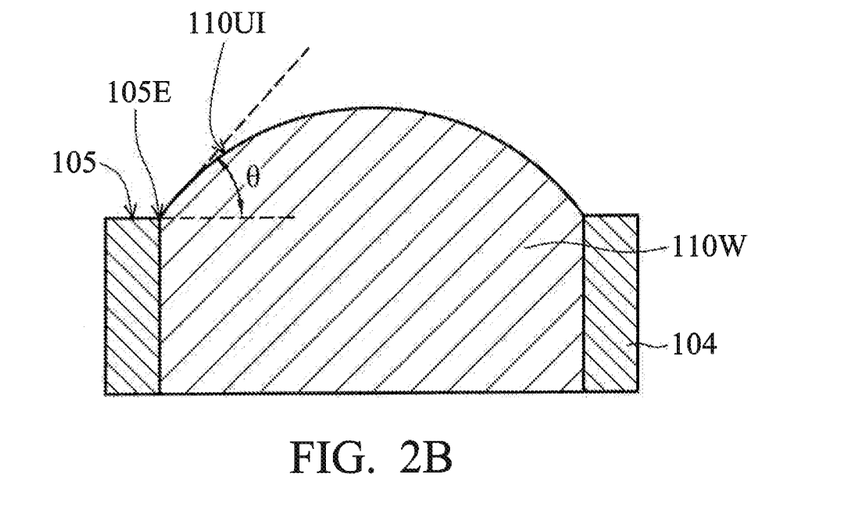

Referring to FIG. 2B, an enlarged cross-section of a portion P of the solid-state imaging device of FIG. 1 according to another embodiment of the invention is shown. In the embodiment of FIG. 2B, the inclined surface 110UI of the color filter segment 110W cuts an edge 105E of the top surface 105 of the partition 104 and does not cover the top surface 105 of the partition 104.

According to embodiments of the invention, a percentage of the top surface of the partition covered by one color filter segment may be 0-50%. When the percentage of the top surface of the partition covered by one color filter segment is 50%, the inclined surfaces of two adjacent color filter segments completely cover the top surface of the partition between the two adjacent color filter segments.

Figure 2C:
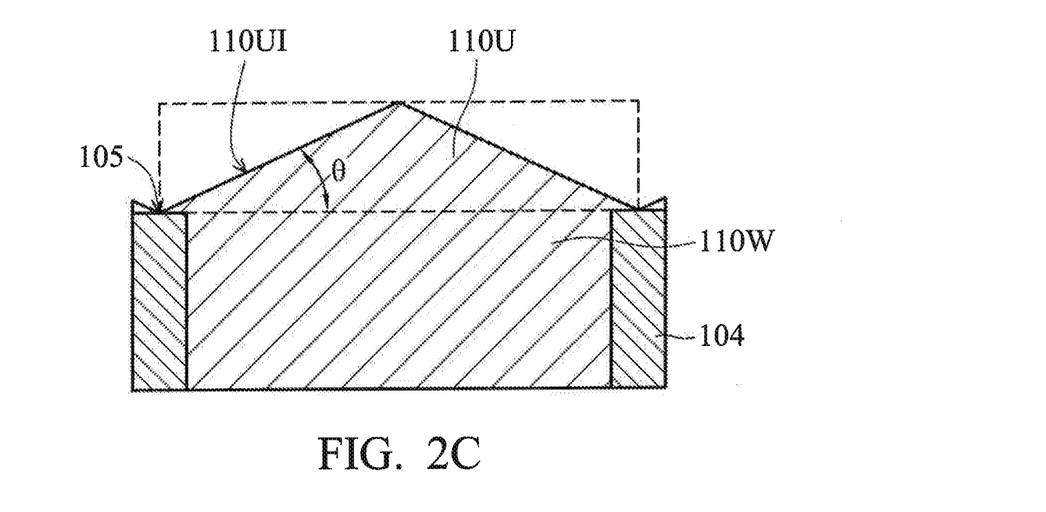

As shown in FIG. 2A and FIG. 2B, the cross-section of the upper portion 110U of the color filter segment 110W is a convex hemispherical shape. Referring to FIG. 2C, an enlarged cross-section of a portion P of the solid-state imaging device of FIG. 1 according to an embodiment of the invention is shown. As shown in FIG. 2C, the cross-section of the upper portion 110U of the color filter segment 110W is tapered. An angle θ between the inclined surface 110UI of the color filter segment 110W and the top surface 105 of the partition 104 is about 12-50 degrees.

Figure 2D:
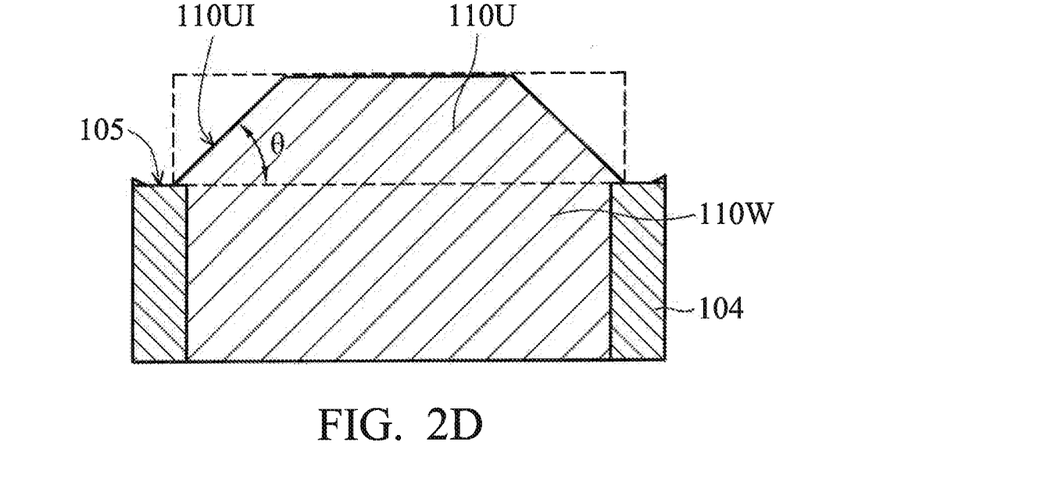

Referring to FIG. 2D, an enlarged cross-section of a portion P of the solid-state imaging device of FIG. 1 according to an embodiment of the invention is shown. As shown in FIG. 2D, the cross-section of the upper portion 110U of the color filter segment 110W is a trapezoid. An angle θ between the inclined surface 110UI of the color filter segment 110W and the top surface 105 of the partition 104 is about 12-50 degrees.

Referring to FIG. 1 again, the solid-state imaging device further includes a microlens structure containing a plurality of microlenses 114 disposed above the color filter 110. Each of the microlenses 114 corresponds to each of the color filter segments of the color filter 110. Light collected by one microlens and passing through one color filter segment will reach one image sensor 102, which corresponds to the color filter segment with the light passing through. Thus, it can avoid color mixing in the solid-state imaging device.

Moreover, a microlens underlying layer 112 is disposed between the color filter 110 and the microlens structure containing the plurality of microlenses 114. The microlens underlying layer 112 can be a planarization layer made of a dielectric material. Further, an anti-reflection layer 116 may be formed on the surfaces of the microlenses 114.

Figure 3A:
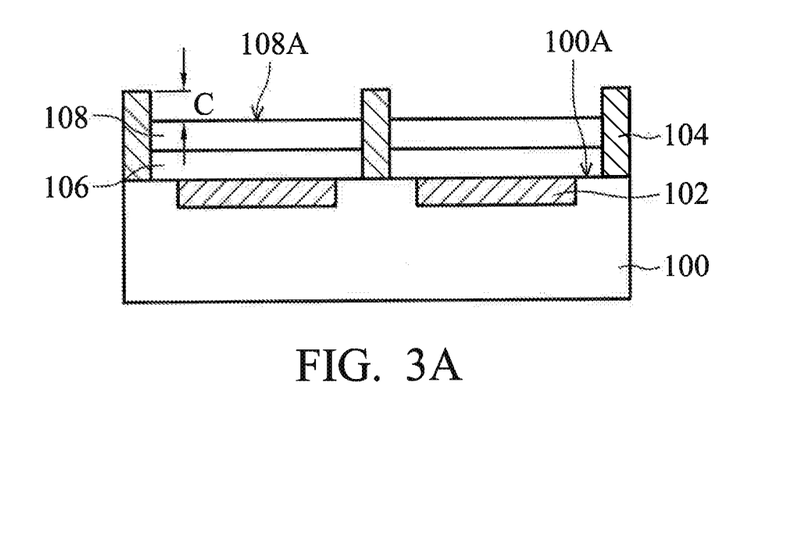
FIGS. 3A-3C show partial schematic cross-sections of the intermediate stages of a method of forming a solid-state imaging device according to an embodiment of the invention.
Figure 3B:
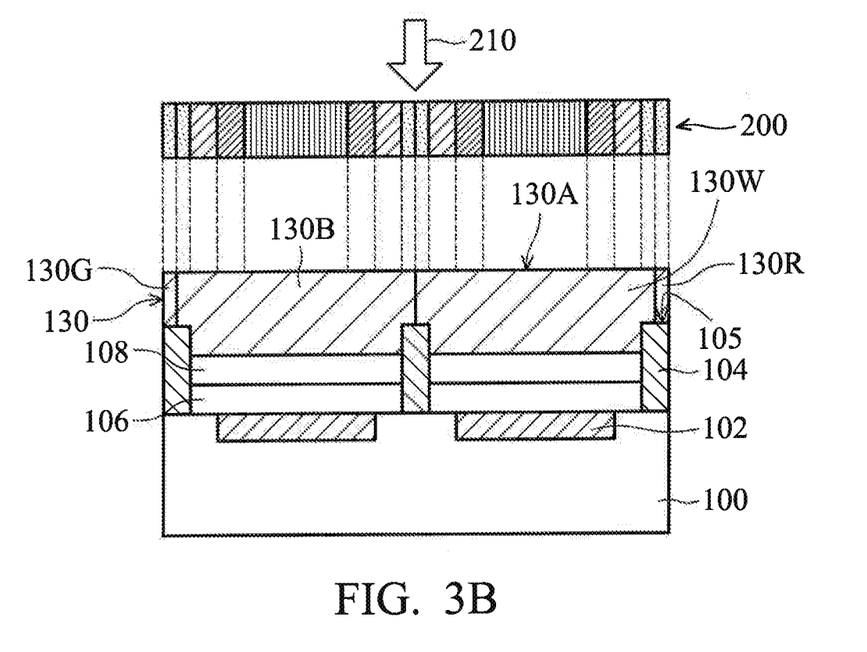
Figure 3C:
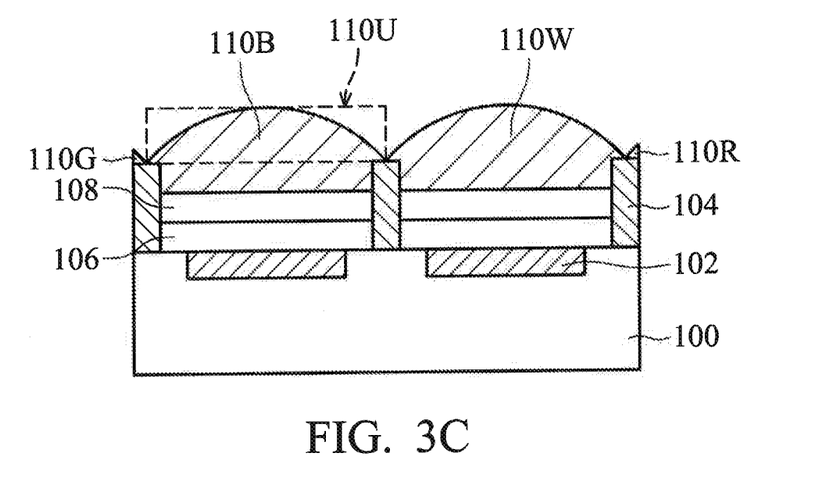

Referring to FIGS. 3A-3C, partial cross-sections of intermediate stages of a method of forming a solid-state imaging device according to an embodiment of the invention are shown. As shown in FIG. 3A, firstly, a semiconductor substrate 100 containing a plurality of image sensors 102 formed thereon is provided. A plurality of partitions 104 is formed on the top surface 100A of the semiconductor substrate 100. The partitions 104 are made of a low refractive index material, for example $SiO_2$, SiN or SiON. The refractive, index of the partitions 104 is lower than the refractive index of the color filter segments 110R, 110G, 110B, and 110W of the color filter 110. In an embodiment, the partitions 104 can be formed by deposition, photolithography, and an etching process.

An anti-current leakage layer 106 is formed on the semiconductor substrate 100 and surrounded by the partitions 104. Then, an anti-reflection layer 108 is formed on the anti-current leakage layer 106 and surrounded by the partitions 104. The anti-current leakage layer 106 and the anti-reflection layer 108 may be made of a metallic material. In an embodiment, the anti-current leakage layer 106 and the anti-reflection layer 108 can be formed by a deposition process.

After the anti-current leakage layer 106 and the anti-reflection layer 108 are formed on the semiconductor substrate 100, the partitions 104 have a height C higher than the top surface 108A of the anti-reflection layer 108.

Referring to FIG. 3B, a color filter coating layer 130 is formed on the anti-reflection layer 108. The color filter coating layer 130 includes a plurality of color filter coating portions with several colors, for example red, green, blue, and white. In an embodiment, the plurality of color filter coating portions are color filter coating portions 130R, 130G, 130B, and 130W, with colors of red, green, blue, and white, respectively. The color filter coating portions 130R, 130G, 130B, and 130W are adjacent and together have a planar surface 130A. The planar surface 130A of the color filter coating portions 130R, 130G, 130B, and 130W is higher than the top surface 105 of the partitions 104.

A halftone mask 200 is provided to perform an exposure process 210 on the color filter coating layer 130. The halftone mask 200 has a pattern of gray-scale properties that enables each of the color filter coating portions 130R, 130G, 130B, and 130W subjected to the exposure process 210 by the halftone mask 200 to have a convex hemispherical shape, a tapered shape or a trapezoid shape, from a cross-sectional view in the upper portion 110U of each of the color filter segments 110R, 110G, 110B, and 110W after a development process.

As shown in FIG. 3C, in an embodiment, after the development process, the upper portion 110U of each of the color filter segments 110R, 110G, 110B, and 110W has a convex hemispherical shape, from a cross-sectional view. The cross-sectional shape of the upper portion 110U of the color filter segments 110R, 110G, 110B, and 110W can be varied by the pattern of the halftone mask 200 and the process parameters of the exposure process and the development process.

The angle θ between the inclined surface 110UI of the color filter segment 110W and the top surface 105 of the partition 104 as shown in FIG. 2A can be adjusted to an optimum condition to improve the sensitivity of the solid-state imaging device for luminance. The angle θ can be adjusted by the pattern of the halftone mask 200 and the process parameters of the exposure process and the development process. Preferably, the angle θ is as acute as possible, but it needs to be larger than 12 degrees. According to the embodiments, an angle θ of 12-50 degrees is preferred.

Next, a microlens underlying layer 112 is formed on the color filter 110 and a microlens structure containing a plurality of microlenses 114 is formed on the microlens underlying layer 112 to complete a solid-state imaging device. Furthermore, an anti-reflection layer 116 can be formed on the plurality of microlenses 114 to complete the solid-state imaging device of FIG. 1.

Figure 4:
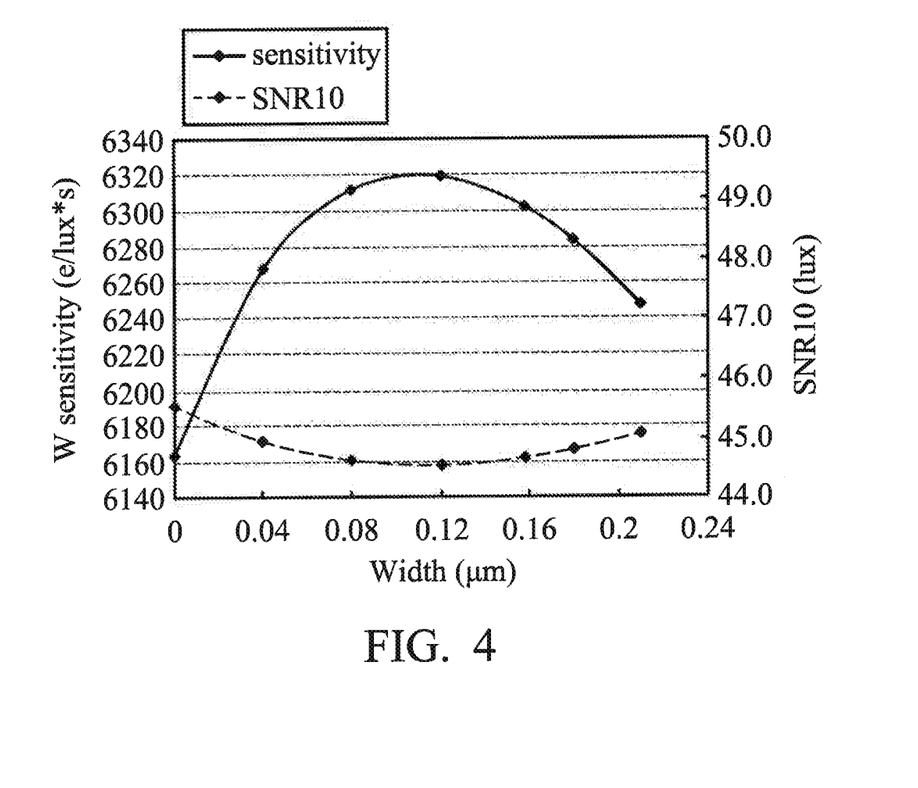
FIG. 4 shows curves of W sensitivity and SNR10 value of a solid-state imaging device versus various partition widths according to several embodiments of the invention.

According to the embodiments, a width W of the partition 104 as shown in FIG. 2A can be adjusted to an optimum condition to enhance the sensitivity of the solid-state imaging device for luminance. Referring to FIG. 4, curves of W sensitivity and SNR10 value of a solid-state imaging device versus various partition widths in the solid-state imaging device are shown. The W sensitivity is the sensitivity of the white pixels of the solid-state imaging device illuminated by collimated light. The W sensitivity has a unit of electron number/lux*second (e/lux*s). The white pixels of the solid-state imaging device correspond to the white color filter segments 110W. The SNR10 value is an index of the brightness of the white pixels of the solid-state imaging device illuminated by collimated light to obtain a signal-to-noise ratio of 10. The SNR10 has a unit of lux. The W sensitivity is preferably a high value, and the SNR10 value is preferably a low value. As shown in FIG. 4, the width of the partition 104 of the solid-state imaging device is preferably in the range of 0.08-0.20 μm. However, if the process ability to form the partition 104 is enhanced, the width of the partition 104 of the solid-state imaging device can be in the range of 0.04-0.20 μm.

Figure 5:
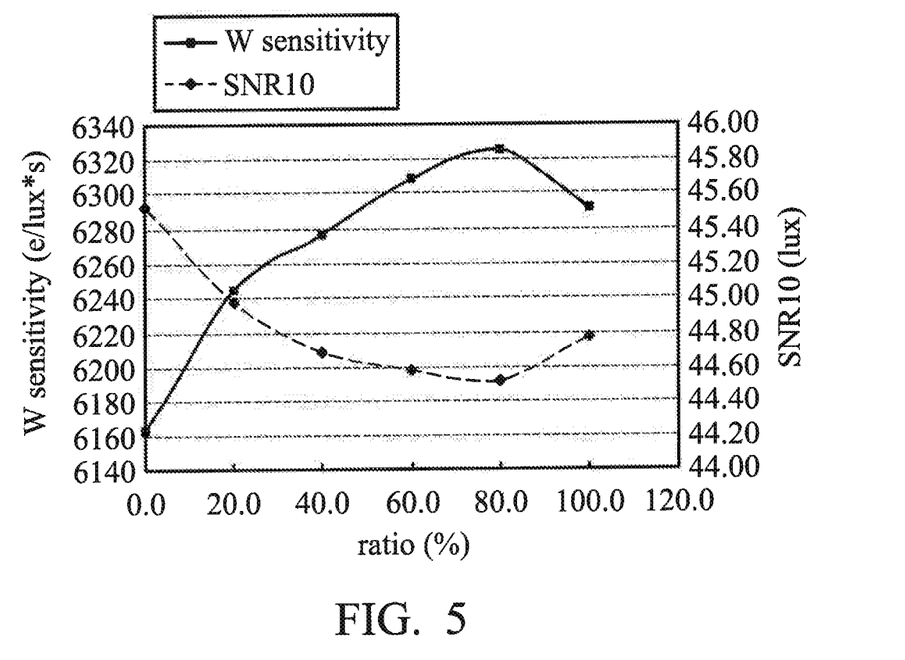
FIG. 5 shows curves of W sensitivity and SNR10 value of a solid-state imaging device versus various ratios of partition height to a color filter segment height, based on the bottom of the color filter segment, according to several embodiments of the invention.

According to the embodiments, the ratio of the height C of the partition 104 to the height D of the color filter segment 110W as shown in FIG. 2A can be adjusted to an optimum condition to enhance the sensitivity of the solid-state imaging device for luminance. Referring to FIG. 5, curves of W sensitivity and SNR10 value of a solid-state imaging device versus various ratios of the height C to the height D in the solid-state imaging device are shown. The W sensitivity and the SNR10 value are defined above. As shown in FIG. 5, the ratio of the height C of the partition to the height D of the color filter segment in the solid-state imaging device is preferably in the range of 40-80%.

In addition, a percentage of the top surface 105 of the partition 104 covered with one color filter segment 110W also affects the sensitivity of the solid-state imaging device for luminance. In an embodiment, as shown in FIG. 2A, the percentage of the top surface 105 of the partition 104 covered with one color filter segment 110W is 50%, i.e., half of the top surface of the partition is covered by one color filter segment. In this embodiment, the W sensitivity of the solid-state imaging device illuminated by collimated light is 6379 (e/lux*s) and the W sensitivity of the solid-state imaging device illuminated by oblique light is 6059 (e/lux*s).

In another embodiment, as shown in FIG. 2B, the percentage of the top surface of the partition covered with one color filter segment is 0%, i.e., the top surface of the partition is not covered with the color filter segment. In this embodiment, the W sensitivity of the solid-state imaging device illuminated by collimated light is 6364 (e/lux*s) and the W sensitivity of the solid-state imaging device illuminated by oblique light is 6047 (e/lux*s).

As a result of a comparison between the two above-mentioned embodiments, half of the top surface of the partition covered with one color filter segment is preferred to enhance the W sensitivity of the solid-state imaging device.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solid-state imaging device, comprising:
a color filter including a first color filter segment having a first height measured from a bottom surface of the first color filter segment to a top surface of the first color filter segment; and a second color filter segment having a second height measured from a bottom surface of the second color filter segment to a top surface of the second color filter segment;
a partition disposed between the first and second color filter segments and having a third height measured from a bottom surface of the partition to a top surface of the partition, wherein the partition has a refractive index lower than those of the first and second color filter segments, and the third height is smaller than the first and second heights; and
a color filter underlying layer disposed between the color filter and a semiconductor substrate,
wherein the color filter underlying layer is surrounded by the partition and the color filter underlying layer comprises an anti-current leakage layer formed on the semiconductor substrate and an anti-reflection layer formed on the anti-current leakage layer, and the color filter is in direct contact with the anti-reflection layer,
wherein the partition is formed on the semiconductor substrate and the bottom of the partition is disposed on the top surface of the semiconductor substrate, and
wherein each of the first and second color filter segments includes a flat bottom surface, a side surface in contact with the partition and an upper portion above the side surface, each of the upper portions includes an inclined surface from the top surface of the partition toward each of the top surfaces of the first and second color filter segments, the inclined surfaces of the first and second color filter segments are connected at a contact point directly on the top surface of the partition and completely cover the top surface of the partition.

2. The solid-state imaging device as claimed in claim 1, wherein the third height is 40-80% of the first and second heights.

3. The solid-state imaging device as claimed in claim 1, wherein the partition has a width of 0.08-0.2 µm.

4. The solid-state imaging device as claimed in claim 1, wherein each of the first and second color filter segments has one color, and each of the colors of the first and second color filter segments comprises red, green, blue or white.

5. The solid-state imaging device as claimed in claim 1, wherein a cross-section of each of the upper portions of the first and second color filter segments comprises a convex hemispherical shape, a taper shape, or a trapezoid shape.

6. The solid-state imaging device as claimed in claim 1, wherein the angle between each of the inclined surfaces of the first and second color filter segments and the top surface of the partition is 12-50 degrees.

7. A solid-state imaging device, comprising:
a semiconductor substrate including a plurality of image sensors;
a color filter including a plurality of color filter segments disposed above the semiconductor substrate, wherein the color filter segment includes a flat bottom surface, a side surface and an upper portion disposed above the side surface;
a plurality of partitions disposed between the plurality of color filter segments, wherein each of the partitions is disposed between any two adjacent color filter segments, each of the partitions has a refractive index lower than that of each of the color filter segments, the upper portion of each of the color filter segments includes an inclined surface from a top of each of the partitions toward a top of each of the color filter segments, the inclined surfaces of the any two adjacent color filter segments are connected at a contact point directly on the top surface of each of the partitions and completely cover the top surface of each of the partitions; and
a color filter underlying layer disposed between the color filter and the semiconductor substrate,
wherein the color filter underlying layer is surrounded by the plurality of partitions and the color filter underlying layer comprises an anti-current leakage layer formed on the semiconductor substrate and an anti-reflection layer formed on the anti-current leakage layer, and the color filter is in direct contact with the anti-reflection layer, and
wherein the plurality of partitions are formed on the semiconductor substrate and the bottom of each of the partitions is disposed on the top surface of the semiconductor substrate.

8. The solid-state imaging device as claimed in claim 7, wherein each of the side surfaces of each of the color filter segments is in contact with the plurality of partitions.

9. The solid-state imaging device as claimed in claim 7, wherein each of the partitions has a width of 0.08-0.2 µm.

10. The solid-state imaging device as claimed in claim 7, wherein each of the color filter segments has one color and the colors of the plurality of color filter segments comprise red, green, blue, and white.

11. The solid-state imaging device as claimed in claim 7, wherein a cross-section of the upper portion of each of the color filter segments comprises a convex hemispherical shape, a taper shape, or a trapezoid shape.

12. The solid-state imaging device as claimed in claim 7, further comprising:
a plurality of microlenses disposed above the color filter, wherein each of the microlenses corresponds to each of the color filter segments.

13. The solid-state imaging device as claimed in claim 7, wherein the angle between the inclined surface of each of the color filter segments and the top of each of the partitions is 12-50 degrees.

* * * * *